(12) United States Patent
Arena et al.

(10) Patent No.: US 9,337,377 B2
(45) Date of Patent: May 10, 2016

(54) METHODS OF FORMING DILUTE NITRIDE MATERIALS FOR USE IN PHOTOACTIVE DEVICES AND RELATED STRUCTURES

(71) Applicant: Soitec, Crolles (FR)

(72) Inventors: Chantal Arena, Mesa, AZ (US); Robin Scott, Chandler, AZ (US); Claudio Canizares, Chandler, AZ (US)

(73) Assignee: SOITEC, Bernin (FR)

( * ) Notice: Subject to any disclaimer, the term of this patent is extended or adjusted under 35 U.S.C. 154(b) by 495 days.

(21) Appl. No.: 13/720,524

(22) Filed: Dec. 19, 2012

(65) Prior Publication Data

US 2013/0164874 A1 Jun. 27, 2013

Related U.S. Application Data

(60) Provisional application No. 61/580,085, filed on Dec. 23, 2011.

(51) Int. Cl.
*C30B 25/16* (2006.01)
*H01L 31/18* (2006.01)
*H01L 21/36* (2006.01)
*H01L 33/00* (2010.01)
*H01L 21/02* (2006.01)
*H01L 27/15* (2006.01)
(Continued)

(52) U.S. Cl.
CPC .......... *H01L 31/184* (2013.01); *H01L 21/0254* (2013.01); *H01L 21/02546* (2013.01); *H01L 21/36* (2013.01); *H01L 27/153* (2013.01); *H01L 33/0066* (2013.01); *H01L 33/0062* (2013.01); *H01L 33/08* (2013.01); *H01L 33/32* (2013.01)

(58) Field of Classification Search
CPC ........ C30B 25/00; C30B 25/02; C30B 25/16; C30B 25/165; C23C 16/00; C23C 16/22; C23C 16/301; C23C 16/303; C23C 14/00; C23C 14/06; C23C 14/0617
USPC ................ 117/84, 88–89, 105, 937, 952, 954
See application file for complete search history.

(56) References Cited

U.S. PATENT DOCUMENTS 5,689,123 A * 11/1997 Major et al. .................. 257/190
6,697,404 B1 2/2004 Sato
6,881,981 B2 4/2005 Tsuda et al.
(Continued)

OTHER PUBLICATIONS

D.B. Jackrel, et al. publication entitled "Dilute nitride GaInNAs and GaInNAs Sb solar cells by molecular beam epitaxy," Journal of Applied Physics, vol. 101, p. 114916 (2007).*
(Continued)

*Primary Examiner* — Kenneth A Bratland, Jr.
(74) *Attorney, Agent, or Firm* — TraskBritt

(57) ABSTRACT

Atomic layer deposition (ALD) or ALD-like deposition processes are used to fabricate dilute nitride III-V semiconductor materials. A first composition of process gases may be caused to flow into a deposition chamber, and a group V element other than nitrogen and one or more group III elements may be adsorbed over the substrate (in atomic or molecular form). Afterward, a second composition of process gases may be caused to flow into the deposition chamber, and N and one or more group III elements may be adsorbed over the substrate in the deposition chamber. An epitaxial layer of dilute nitride III-V semiconductor material may be formed over the substrate in the deposition chamber from the sequentially adsorbed elements.

30 Claims, 4 Drawing Sheets

(51) Int. Cl.
   *H01L 33/32* (2010.01)
   *H01L 33/08* (2010.01)

(56) References Cited

U.S. PATENT DOCUMENTS

| | | | |
|---|---|---|---|
| 7,012,283 | B2 | 3/2006 | Tsuda et al. |
| 2004/0026710 | A1 | 2/2004 | Tsuda et al. |
| 2005/0112281 | A1 | 5/2005 | Bhat |
| 2006/0281202 | A1 | 12/2006 | Ishida et al. |
| 2009/0223442 | A1 | 9/2009 | Arena et al. |
| 2010/0052016 | A1* | 3/2010 | Hooper et al. ............ 257/201 |
| 2010/0148202 | A1 | 6/2010 | Tomoda |
| 2013/0181308 | A1 | 7/2013 | Arena et al. |

OTHER PUBLICATIONS

Chalker et al., The Microstructural Influence of Nitrogen Incorporation in Dilute Nitride Semiconductors, Journal of Physics: Condensed Matter 16 (2004) S3161-S3170.

Dimroth et al., Comparison of Dilute Nitride Growth on a Single- and 8x4-inch Multiwafer MOVPE System for Solar Cell Applications, Journal of Crystal Growth, vol. 272 (2004) pp. 726-731.

Du et al, Growth of GaNxAs1-x Atomic Monolayers and their insertion in the Vicinity of GaInAs Quantum Wells, IEE Proc.—Optoelectron, vol. 151, No. 5, Oct. 2004, pp. 254-258.

Jackrel et al., Dilute Nitride GaInNAs and GaInNAsSb Solar Cells by Molecular Beam Epitaxy, Journal of Applied Physics, vol. 101 (2007) pp. 114916-1-114916-8.

Kurtz et al., Understanding the Potential and Limitations of Dilute Nitride Alloys for Solar Cells, NREL National Renewable Energy Laboratory, Conference Paper NREL/CP-250-38998, Nov. 2005, 5 pages.

Larsen et al., GaAs Growth Using Tertiarybutylarsine and Trimethylgallium, Journal of Crystal Growth, vol. 93 (1998) pp. 15-19.

Mintairov et al., Atomic Arrangement and Emission Properties of GaAs(In, Sb) N Quantum Wells, Semiconductor Science and Technology, vol. 24 (2009) 075013, 8 pages.

Roman, Jose Maria, State-of-the-Art of III-V Solar Cell Fabrication Technologies, Device Designs and Applications, Advanced photovoltaic Cell Design, Apr. 27, 2004, 8 pages.

Friedman et al., 1-eV Solar Cells with GaInNAs Active Layer, Journal of Crystal Growth, vol. 195, (1998) pp. 409-415.

Sakai et al., Green Light Emission From GaInNAs/GaN Multiple Quantum Well, Japanese Journal of Applied Physics, Japan Society of Applied Physics, vol. 37, No. 12B, Part 2, Dec. 15, 1998, p. L1508.

Kaul et al., Surface Chemistry of New As Precursors for MOVPE and MOMBE: Phenylarsine and Tertiarybutylarsine on GaAs(100), Journal of Cyrstal Growth, vol. 123 (1992), pp. 411-422.

Kurtz et al "InGaAsN solar cells with 1.0 eV band gap, lattice matched to GaAs", Applied Physics Letters, AIP, American Institute of Physics, Melville, NY, US, vol. 74, No. 5, 1 Feb. 1, 1999, pp. 729-731.

Sormunen et al., "GaN/GaAS (100) superlattices grown by metalorganic vapor phase epitaxy using dimethylhydrazine precursor". Journal of Crystal Growth, Elsevier, Amsterdam, NL, vol. 270, No. 3-4, 1 Oct. 1, 2004, pp. 346-350.

Wu et al., "Strain-Compensated GaAsN/InGaAs Superlattice Structure Solar Cells", Japanese Journal of Applied Physics, Part 2 (Letters) Japan Soc. Appl. Phys., Jul. 2006, pp. L647-L649, Japan.

International Search Report for International Application No. PCT/IB2012/002355 mailed Mar. 3, 2013, 3 pages.

International Written Opinion for International Application No. PCT/IB2012/002355 mailed Mar. 3, 2013, 6 pages.

International Preliminary Report on Patentability for International Application No. PCT/IB2012/002355 date Jun. 24, 2014, 7 pages.

Taiwanese Office and Search Report for Taiwanese Application No. 101145318, dated Dec. 9, 2015, 7 pages.

Chinese Office Action and Search Report for Chinese Application No. 201280062665.4 dated Jan. 27, 2016, 7 pages.

\* cited by examiner

METHODS OF FORMING DILUTE NITRIDE MATERIALS FOR USE IN PHOTOACTIVE DEVICES AND RELATED STRUCTURES

CROSS-REFERENCE TO RELATED APPLICATIONS

This application claims the benefit of U.S. Provisional Patent Application Ser. No. 61/580,085, filed Dec. 23, 2011, the disclosure of which is hereby incorporated herein in its entirety by this reference. The subject matter of this application is related to the subject matter of U.S. Provisional Patent Application Ser. No. 61/580,095, filed Dec. 23, 2011, in the name of Arena et al. and entitled "Methods of Fabricating Dilute Nitride Semiconductor Materials for use in Photoactive Devices and Related Structures," the disclosure of which is hereby incorporated herein in its entirety by this reference.

FIELD

Embodiments of the disclosure generally relate to methods of fabricating dilute nitride III-V semiconductor materials for use in photoactive devices, to methods of fabricating photoactive devices including dilute nitride III-V semiconductor materials, and to photoactive devices formed by such methods.

BACKGROUND

Photoactive devices are semiconductor devices that employ semiconductor material to convert electromagnetic radiation into electrical energy or to convert electrical energy into electromagnetic radiation. Photoactive devices include, for example, photovoltaic cells, light-emitting diodes, and laser diodes.

Photovoltaic cells (also referred to in the art as "solar cells" or "photoelectric cells") are used to convert energy from light (e.g., sunlight) into electricity. Photovoltaic cells generally include one or more pn junctions, and can be manufactured using conventional semiconductor materials, such as silicon, as well as III-V semiconductor materials. Photons from impinging electromagnetic radiation (e.g., light) are absorbed by the semiconductor material proximate the pn junction, resulting in the generation of electron-hole pairs. The electrons and holes generated by the impinging radiation are driven in opposite directions by a built-in electric field across the pn junction, resulting in a voltage between the n region and the p region on opposing sides of the pn junction. This voltage may be used to produce electricity. Defects in the crystal lattices of the semiconductor materials at the pn junctions provide locations at which electrons and holes previously generated by absorption of radiation can recombine, thereby reducing the efficiency by which the radiation is converted into electricity by the photovoltaic cells.

The photons of the electromagnetic radiation that impinge on a photovoltaic cell must have sufficient energy to overcome the bandgap energy of the semiconductor material to generate an electron-hole pair. Thus, the efficiency of the photovoltaic cell is dependent upon the percentage of the impinging photons that have an energy corresponding to the bandgap energy of the semiconductor material. Stated another way, the efficiency of the photovoltaic cell is at least partially dependent upon the relationship between the wavelength or wavelengths of the radiation impinging on the photovoltaic cell and the bandgap energy of the semiconductor material. Sunlight is emitted over a range of wavelengths. As a result, photovoltaic cells have been developed that include more than one pn junction, wherein each pn junction comprises semiconductor material having a different bandgap energy so as to capture light at different wavelengths and increase the efficiencies of the photovoltaic cells. Such photovoltaic cells are referred to as "multi-junction" or "MJ" photovoltaic cells.

Thus, the efficiency of a multi junction photovoltaic cell may be increased by selecting the semiconductor materials at the pn junctions to have band-gap energies that are aligned with the wavelengths of light corresponding to the wavelengths of highest intensity in the light to be absorbed by the photovoltaic cells, and by decreasing the concentration of defects in the crystal lattices of the semiconductor materials at the pn junctions. One way to decrease the concentration of defects in the crystal lattices of the semiconductor materials is to employ semiconductor materials that have lattice constants and coefficients of thermal expansion that are closely matched with one another.

It has been proposed to employ the dilute nitride III-V semiconductor material $Ga_{1-y}In_yN_xAs_{1-x}$, wherein y is about 0.08 and x is about 0.028, in one pn junction of a multi junction photovoltaic cell. Such a dilute nitride III-V semiconductor material may exhibit a bandgap energy of from about 1.0 eV to about 1.1 eV.

Such dilute nitride III-V semiconductor materials have proven difficult to fabricate, at least on a commercial scale. These difficulties are partly due to the disparities in the atomic radii of the various elements of the material, which range from about 0.75 Angstroms to about 1.62 Angstroms. Examples of methods that have been used to fabricate GaInNAs are disclosed in, for example, Dimroth et al., *Comparison of Dilute Nitride Growth on a Single-and 8×4-inch Multiwafer MOVPE System for Solar Cell Applications*, JOURNAL OF CRYSTAL GROWTH 272 (2004) 726-731, and in Chalker et al., *The Microstructural Influence of Nitrogen Incorporation in Dilute Nitride Semiconductors*, JOURNAL OF PHYSICS: CONDENSED MATTER 16 (2004) S3161-S3170, each of which is incorporated herein in its entirety by this reference.

BRIEF SUMMARY

This summary is provided to introduce a selection of concepts in a simplified form, such concepts being further described in the detailed description below of some example embodiments. This summary is not intended to identify key features or essential features of the claimed subject matter, nor is it intended to be used to limit the scope of the claimed subject matter.

The present disclosure includes methods of fabricating dilute nitride III-V semiconductor material. A first plurality of process gases may be introduced into a deposition chamber, and a first layer comprising As and one or more of B, Al, Ga, In, and Ti may be deposited over a substrate in the deposition chamber from the first plurality of process gases. Thus, the first plurality of process gases includes an arsenic-containing precursor gas. The first layer may be at least substantially free of N. After depositing the first layer, a second plurality of process gases may be introduced into the deposition chamber, and a second layer comprising N and one or more of B, Al, Ga, In, and Ti may be deposited over the substrate in the deposition chamber from the second plurality of process gases. Thus, the second plurality of process gases includes a nitrogen-containing precursor gas. A dilute nitride III-V semiconductor material may be grown over the substrate in the deposition chamber using the first layer and the second layer.

In additional methods of forming dilute nitride III-V semiconductor material, a substrate may be positioned within a deposition chamber. A first composition of process gases may be caused to flow into the deposition chamber, and As and one or more of B, Al, Ga, In, and Ti may be adsorbed over the substrate in the deposition chamber. After flowing the first composition of process gases into the deposition chamber, a second composition of process gases may be caused to flow into the deposition chamber, and N and one or more of B, Al, Ga, In, and Ti may be adsorbed over the substrate in the deposition chamber. An epitaxial layer of dilute nitride III-V semiconductor material may be formed over the substrate in the deposition chamber from the adsorbed elements.

Additional embodiments of the disclosure include photoactive devices, such as photovoltaic cells, light-emitting diodes, and laser diodes, which are fabricated in accordance with methods as disclosed herein.

BRIEF DESCRIPTION OF THE DRAWINGS

The present disclosure may be understood more fully by reference to the following detailed description of example embodiments, which are illustrated in the appended figures in which.

DETAILED DESCRIPTION OF EMBODIMENTS OF THE INVENTION

The illustrations presented herein are not meant to be actual views of any particular photoactive device or deposition system, but are merely idealized representations that are employed to describe embodiments of the present disclosure.

As used herein, the term "III-V semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi). For example, III-V semiconductor materials include, but are not limited to, GaN, GaP, GaAs, InN, InP, InAs, MN, AlP, AlAs, InGaN, InGaP, GaInN, InGaNP, GaIn-NAs, etc.

The teens "gas" and "vapor" are used synonymously herein and mean and include any substance in a gaseous state as opposed to a liquid or solid state.

In accordance with embodiments of the present disclosure, atomic layer deposition (ALD) or ALD-like methods are used to deposit dilute nitride III-V semiconductor materials on a substrate. The methods may be employed to fabricate photoactive devices, such as photovoltaic cells and light-emitting devices (e.g., light-emitting diodes (LEDs), laser diodes, etc.). Non-limiting examples of such photoactive devices including dilute nitride III-V semiconductor material are described below with reference to FIGS. 1 and 2, and embodiments of methods that may be employed to fabricate such photoactive devices including dilute nitride III-V semiconductor material are described below with reference to FIGS. 3 through 6.

Figure 1:
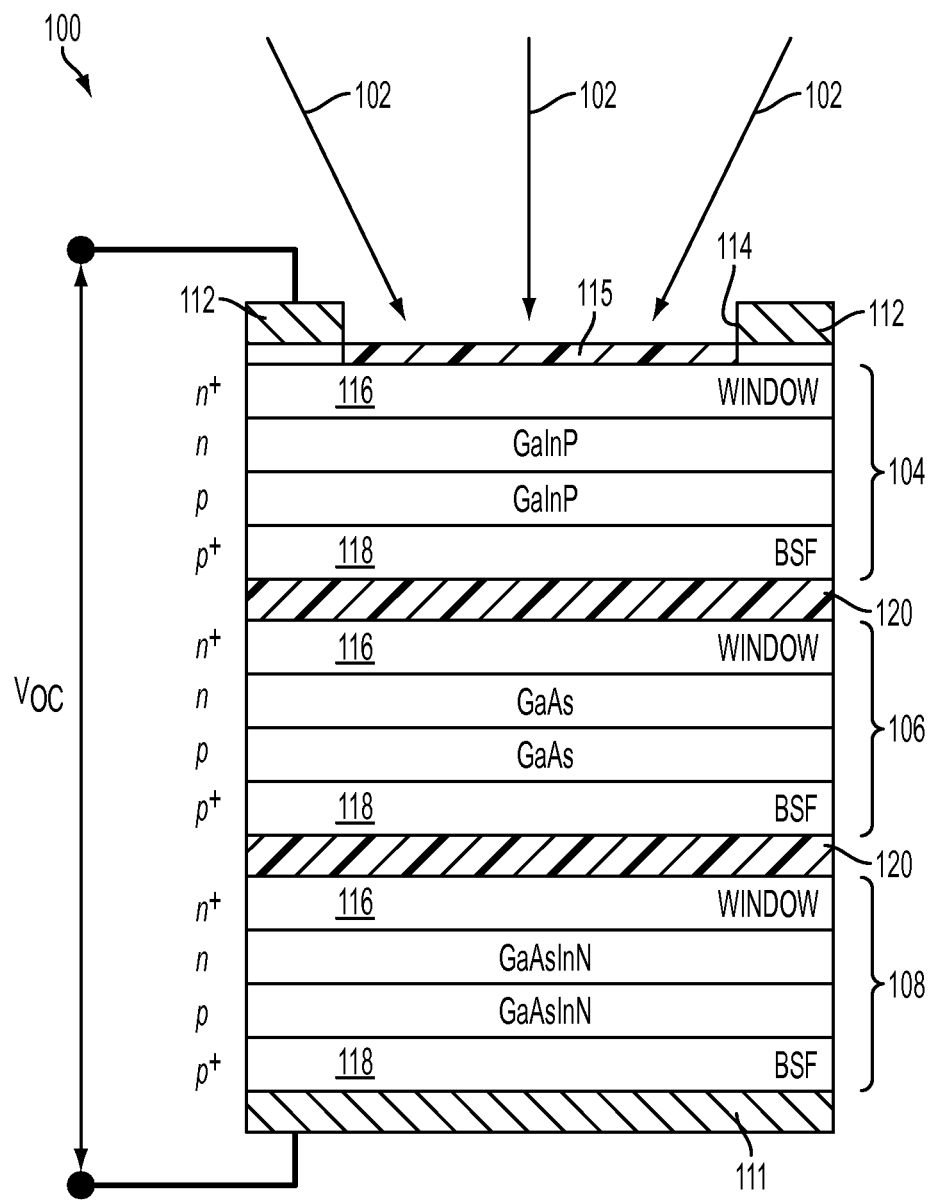
FIG. 1 is simplified schematic diagram illustrating a partial cross-sectional view of a triple junction photovoltaic cell that includes a dilute nitride III-V semiconductor material, which may be fabricated in accordance with embodiments of methods of the disclosure.

FIG. 1 illustrates a photoactive device that may be formed using embodiments of methods of the present disclosure. The photoactive device of FIG. 1 comprises a photovoltaic cell 100 (e.g., a solar cell). The photovoltaic cell 100 is configured to convert electromagnetic radiation 102 (e.g., light) that impinges on the photovoltaic cell 100 into electricity. The photovoltaic cell 100 of FIG. 1 is a multi junction photovoltaic cell 100, which includes a first subcell 104, a second subcell 106, and a third subcell 108. Each of the subcells 104, 106, 108 includes a multi-layer stack of semiconductor materials. At least one of the subcells 104, 106, 108 comprises a dilute nitride III-V semiconductor material.

Each multi-layer stack of semiconductor materials in the subcells 104, 106, 108 includes a pn junction. In other words, each multi-layer stack of semiconductor materials includes a layer of p-type material and an adjacent layer of n-type semiconductor material, such that a pn junction is defined at the interface between the adjacent p-type and n-type semiconductor materials. As known in the art, a charge depletion region (also referred to in the art as a space charge layer) and an internal electric field is developed at the pn junction. As photons of the electromagnetic radiation 102 enter the photovoltaic cell 100, they may be absorbed within the semiconductor materials in the multi-layer stacks of semiconductor material in the subcells 104, 106, 108. When a photon has an energy corresponding to the bandgap energy of the respective semiconductor material in which the photon is absorbed, an electron-hole pair may be generated within the semiconductor material. When photons are absorbed in the charge depletion regions at the pn junctions and result in the formation of electron hole pairs therein, the internal electric field at the pn junction drives the electron toward the n-type region and the hole in the opposite direction toward the p-type region. As electrons accumulate in the n-type region and holes accumulate in the p-type region, a voltage is generated across the pn junction. The voltages of the subcells 104, 106, 108 are accumulated (e.g., in series) across the entire photovoltaic cell 100 to provide an open circuit voltage $V_{OC}$ between a first contact layer 111 on one side of the photovoltaic cell 100 and a second contact layer 112 on an opposing side of the photovoltaic cell 100. The first contact layer 111 and the second contact layer 112 may comprise conductive metals or metal alloys. The second contact layer 112 may be discontinuous so as to provide at least one aperture 114 through the second contact layer 112 through which the electromagnetic radiation 102 may pass and enter the subcells 104, 106, 108. An antireflective (AR) coating 115 may be provided on the photovoltaic cell 100 in the aperture 114, as shown in FIG. 1.

Each of the subcells 104, 106, 108 may be configured to absorb electromagnetic radiation 102 primarily at different wavelengths by employing semiconductor materials at the pn junction that have different compositions and bandgap energies. By way of example and not limitation, the first subcell 104 may comprise a pn junction formed in InGaP III-V semiconductor material having a bandgap energy of approximately 1.88 eV, the second subcell 106 may comprise a pn junction formed in GaAs III-V semiconductor material having a bandgap energy of approximately 1.42 eV, and the third subcell 108 may comprise a pn junction formed in GaInNAs, which is a dilute nitride III-V semiconductor material and may have a bandgap energy of approximately 1.00 eV.

At least one of the subcells 104, 106, 108 comprises a dilute nitride III-V semiconductor material, which, in the embodiment of FIG. 1, is the GaInNAs of the third subcell 108. The GaInNAs may comprise $Ga_{1-y}In_yN_xAs_{1-x}$, wherein y is greater than 0.0 and less than 1.0 (e.g., between about 0.08 and about 1), and x is between about 0.1 and about 0.5. The bandgap energy of the $Ga_{1-y}In_yN_xAs_{1-x}$ is a function of the composition thereof (i.e., the values of x and y). Thus, depending upon the values of x and y, the $Ga_{1-y}In_yN_xAs_{1-x}$ may exhibit a bandgap energy of between about 0.09 eV and about 1.2 eV. The $Ga_{1-y}In_yN_xAs_{1-x}$ may exhibit a bandgap energy of between about 1.00 eV and about 1.1 eV. Other dilute nitride materials, such as GaInNAsSb may be employed in additional embodiments of the disclosure.

With continued reference to FIG. 1, each of the subcells 104, 106, 108 may include additional layers of material, which may include, for example, window layers 116 and back surface field (BSF) layers 118. The window layers 116 and BSF layers 118 are used to transition the material composition across the photovoltaic cell 100 in a manner that mitigates defects and, hence, promotes current flow without electron-hole recombination, and that allows the electromagnetic radiation 102 to propagate through the photovoltaic cell 100 to the various subcells 104, 106, 108.

As shown in FIG. 1, tunnel junction layers 120 may be disposed between the subcells 104, 106, 108. The tunnel junction layers 120 are used to provide an interconnection having low electrical resistance between the opposing n- and p-type regions of the subcells 104, 106, 108 adjacent the tunnel junction layers 120 on opposing sides thereof. The tunnel junction layers 120 may be at least substantially transparent to the electromagnetic radiation 102 to allow the electromagnetic radiation 102 to penetrate through the tunnel junction layers 120 to underlying subcells 104, 106, 108. Each tunnel junction layer 120 may comprise a highly doped n-type layer and a highly doped p-type layer (not shown). The semiconductor material or materials of the highly doped n- and p-type layers may have a wide band gap. In this configuration, the depletion region may be relatively narrow, and tunneling of electrons from the conduction band in the n-type region to the valence band in the p-type region is facilitated. Thus, the tunnel junction layers 120 may comprise a plurality of layers of semiconductor material (e.g., III-V semiconductor material) although they are schematically illustrated in a simplified manner as a single layer in FIG. 1.

Figure 2:
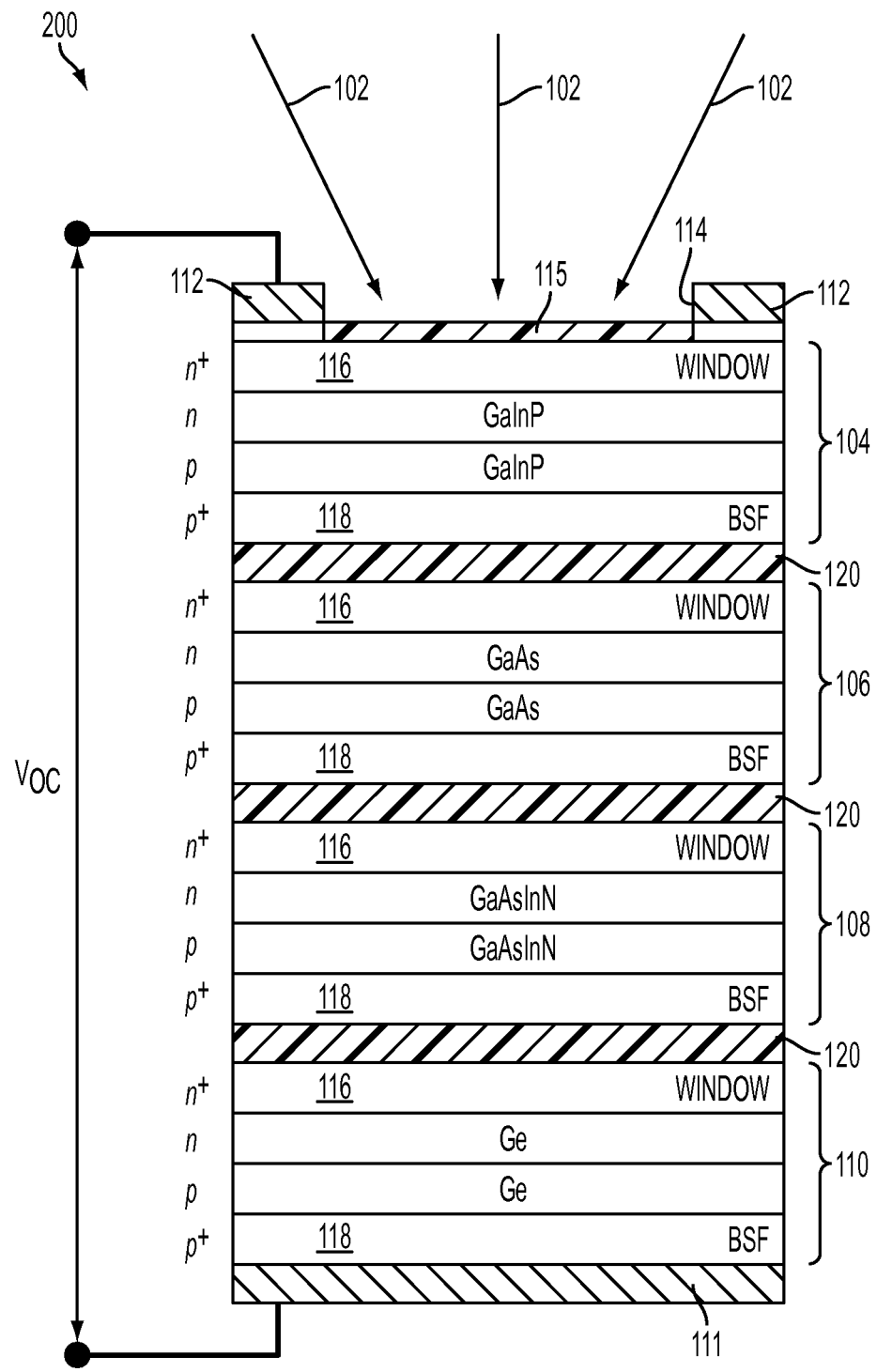
FIG. 2 is a simplified schematic diagram illustrating a partial cross-sectional view of a quadruple junction photovoltaic cell that includes a dilute nitride III-V semiconductor material, which may be fabricated in accordance with embodiments of methods of the disclosure.

Photovoltaic cells having less or more subcells (e.g., one, two, four, five, etc.) also may be fabricated in accordance with embodiments of the present disclosure. For example, FIG. 2 illustrates another photovoltaic cell 200 that is generally similar to the photovoltaic cell 100 of FIG. 1. The photovoltaic cell 200, however, further includes a fourth subcell 110. By way of example and not limitation, the fourth subcell 110 may comprise a pn junction formed in Ge semiconductor material having a bandgap energy of approximately 0.66 eV. By including the additional fourth subcell 110, the efficiency of the photovoltaic cell 200 of FIG. 2 may be higher than that of the photovoltaic cell 100 of FIG. 1.

In addition to the optical and electrical properties that are to be exhibited by the various layers of material in the photovoltaic cells 100, 200, the various III-V semiconductor materials therein are crystalline (and often consist essentially of a single crystal of the material) and may be subject to physical constraints and considerations. The presence of defects in the crystalline structure of the various III-V semiconductor materials can provide locations at which electrons and holes collect and recombine, thereby reducing the efficiency of the photovoltaic cells 100, 200. As a result, it is desirable to form the various III-V semiconductor materials to have relatively low defect concentrations therein. To reduce the concentration of defects at the interfaces between the various III-V semiconductor materials, the compositions of the various layers may be selected such that adjacent layers of material have generally matching lattice constants and thermal expansion coefficients. These additional design parameters provide further restrictions on the materials that may be successfully employed in the various III-V semiconductor materials within the photovoltaic cells 100, 200.

Photovoltaic devices that include dilute nitride III-V semiconductor material, such as the photovoltaic device 100 of FIG. 1 and the photovoltaic device 200 of FIG. 2, which comprise the dilute nitride III-V semiconductor material GaInNAs in the third subcell 108, have proven difficult to fabricate in high volumes and with high yield. As previously mentioned, the concentration of nitrogen in GaInNAs that results in the GaInNAs exhibiting a bandgap energy of about 1.00 eV is about two atomic percent (2 at %). The elements in GaInNAs have varying atomic radii, as shown in Table 1 below.

TABLE 1

| ELEMENT | ATOMIC RADIUS (Å) |
|---------|-------------------|
| Ga      | 1.22              |
| In      | 1.62              |
| As      | 1.21              |
| N       | 0.75              |

Due at least in part to the disparate atomic radii of these elements, there is a tendency for a GaAsN phase to separate out from the GaInNAs as the nitrogen content in the GaInNAs increases. Although addition of more indium (which has a relatively large atomic radius) may mitigate this effect to some extent, defect related recombination centers continue to plague currently available GaInNAs and other dilute nitride III-V semiconductor materials.

In accordance with embodiments of the present disclosure, GaInNAs and other dilute nitride III-V semiconductor materials may be formed for use in photoactive devices, such as the photovoltaic cell 100 of FIG. 1 and the photovoltaic cell 200 of FIG. 2, light-emitting diodes, laser diodes, and other photoactive devices, by using an ALD-like deposition process to sequentially deposit alternating layers of elemental constituents used to form the dilute nitride III-V semiconductor material. These methods may be carried out in some embodiments within a metalorganic chemical vapor deposition (MOCVD) or a hydride vapor phase epitaxy (HVPE) deposition chamber.

In general, a dilute nitride III-V semiconductor material may be fabricated by flowing a first plurality of process gases into a deposition chamber, one of which process gases may include an arsenic-containing precursor gas, and adsorbing As and one or more of B, Al, Ga, In, and Ti in a first layer on a substrate. Thereafter, a second plurality of process gases may be introduced into the deposition chamber, one of which may include a nitrogen-containing precursor gas, and N and one or more of B, Al, Ga, In, and Ti may be adsorbed in a second layer on the substrate in the deposition chamber. The sequential introduction into the chamber of the first plurality of process gases and the second plurality of process gases may be repeated any number of times. An epitaxial layer of dilute nitride III-V semiconductor material may be formed on the substrate from the adsorbed elements thereon. Such methods are described in further detail below with reference to FIGS. 3 through 5.

Figure 3:
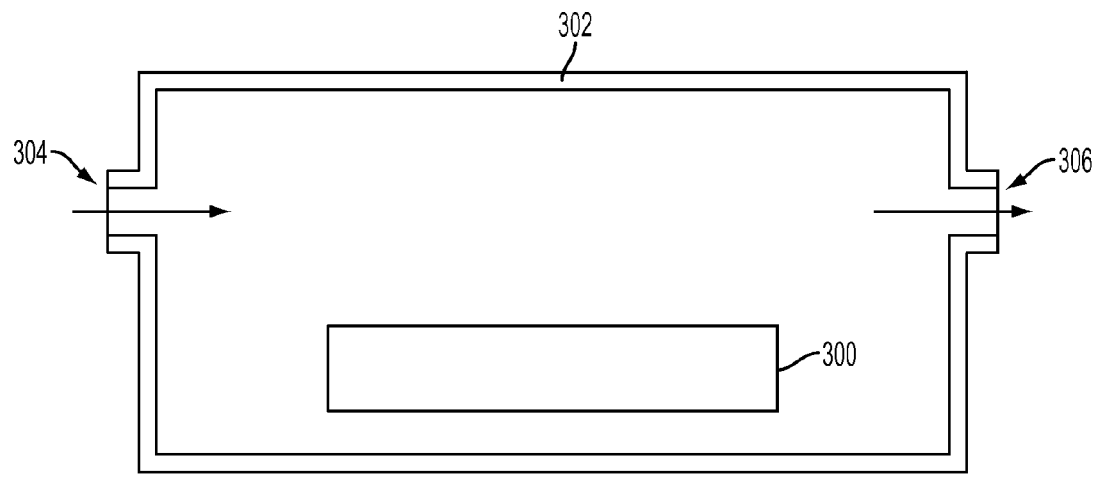
FIGS. 3 through 6 are simplified schematic diagrams illustrating the fabrication of a dilute nitride III-V semiconductor material within a deposition chamber in accordance with embodiments of methods of the disclosure.

Referring to FIG. 3, a substrate 300 may be positioned within a deposition chamber 302. The deposition chamber 302 may comprise an MOCVD or an HYPE deposition chamber. The deposition chamber 302 may comprise one or more inlets 304 through which process gases may be introduced into the deposition chamber 302 during a deposition process, and one or more outlets 306 through which unused process gases and gaseous byproducts may be vented out from the deposition chamber 302 during a deposition process.

The substrate 300 may comprise one or more previously formed layers of material. In some embodiments, the substrate 300 may comprise an at least partially formed photoactive device. For example, the substrate 300 may comprise the portion of the photovoltaic cell 100 of FIG. 1 shown below the GaInNAs layers of the third subcell 108 or the portion of the photovoltaic cell 200 of FIG. 2 shown below the GaInNAs layers of the third subcell 108.

In some embodiments, the substrate 300 may comprise a buffer layer exposed at the upper major surface of the substrate 300, which may have a lattice parameter close to that of the GaInNAs or other nitride layer to be formed thereon. For example, if it is desired to epitaxially grow GaInNAs on the substrate 300, the substrate 300 may include a GaAs buffer layer thereon that is exposed at the upper major surface of the substrate 300. The GaInNAs then may be epitaxially grown directly on the exposed upper surface of the GaAs buffer layer. In some embodiments, a base of the substrate 300 may comprise, for example, a sapphire ($Al_2O_3$) substrate.

Figure 4:
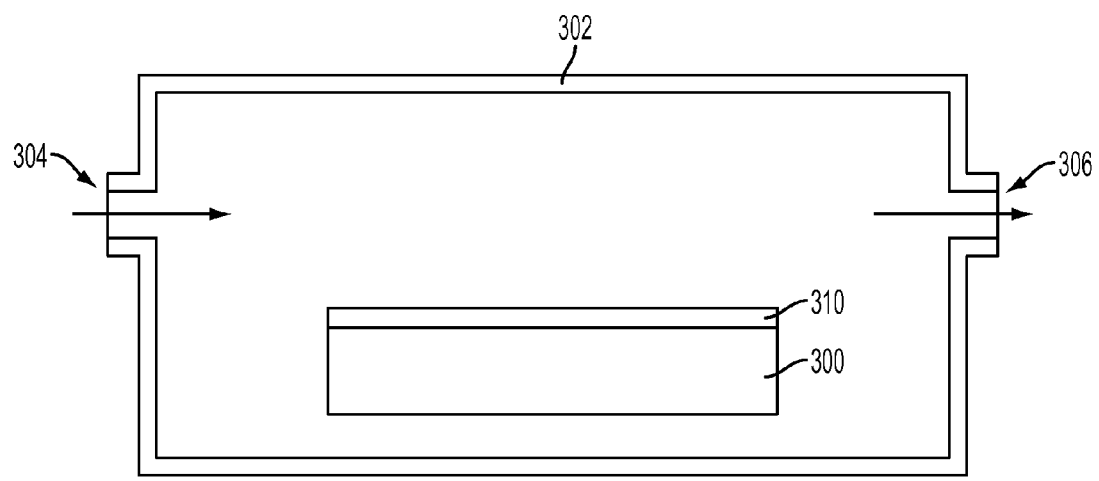

Referring to FIG. 4, a first plurality of process gases may be introduced into the deposition chamber 302 by, for example, flowing the first plurality of process gases through the deposition chamber 302 from the inlet 304 to the outlet 306, to form a first layer of adsorbed elements 310 thereon.

The first plurality of process gases may include one or more precursor gases from which As and one or more of B, Al, Ga, In, and Ti may be adsorbed over the substrate 300 to form the first layer of adsorbed elements 310. In some embodiments, the first layer of adsorbed elements 310 may comprise a monolayer, or a few monolayers of atomic and/or molecular species including the elements.

The first plurality of process gases may include an arsenic-containing precursor gas for the adsorption of the As, and may be at least substantially free of nitrogen-containing precursor gas (although nitrogen gas, which is at least substantially inert, optionally may be employed as a non-precursor process gas, such as a carrier gas). For example, the arsenic-containing precursor gas may comprise $AsR_3$, wherein each R is individually selected from the group consisting of hydrogen, alkyl, aryl, and vinyl groups. In some embodiments, the arsenic-containing precursor gas may comprise at least one of arsine and a metalorganic arsine precursor (e.g., a metalorganic molecular species that will decompose within the deposition chamber 302 to form arsine). An example of such a metalorganic arsine precursor is tertiarybutylarsine ($AsH_2C(CH_3)_3$) (TBAs).

To deposit As from arsine or a metalorganic arsine precursor, the substrate 300 and/or interior of the deposition chamber 302 may be heated to elevated temperatures during the deposition process. Arsine may be about fifty percent (50%) pyrolized at about 600° C. TBAs may be about twenty-five percent (25%) decomposed at temperatures less than about 500° C., and may be substantially fully decomposed at about 610° C. Thus, in accordance with some embodiments, the substrate 300 and/or the interior of the deposition chamber 302 may be heated in the presence of an arsenic-containing gas such as arsine and/or a metalorganic arsine precursor (e.g., TBAs) to at least about 500° C., and, more particularly, to at least about 600° C.

Additional gases or vapors optionally may be introduced into the deposition chamber 302 to assist the decomposition of the arsine-containing gas as needed or desirable. For example, hydrogen gas may be introduced into the deposition chamber 302 to assist with the decomposition. Arsine decomposes in the presence of hydrogen gas according to the reaction represented in Equation 1 below.

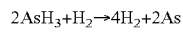

$$2AsH_3 + H_2 \rightarrow 4H_2 + 2As \qquad \text{Eq. 1:}$$

Decomposition of TBAs can occur via two routes. In a first route, intra-molecular coupling between TBAs molecules can result in decomposition according to the reaction represented in Equation 2 below.

$$TBAs \rightarrow C_4H_{10} + AsH \qquad \text{Eq. 2:}$$

The intra-molecular coupling is believed to proceed by bonding of the tertiarybutyl group with one of the H atoms attached to the As atom to form the $C_4H_{10}$. The AsH produced by the reaction of Equation 2 will not decompose until the temperature within the deposition chamber 302 is sufficiently high to result in decomposition of arsine ($AsH_3$) as well.

In a second route, TBAs may decompose through β-elimination at relatively higher temperatures according to the reaction represented in Equation 3 below.

$$TBAs \rightarrow C_4H_8 + AsH_3 \qquad \text{Eq. 3:}$$

Thus, in accordance with some embodiments of the present disclosure, TBAs may be decomposed in the deposition chamber 302 to form at least one of AsH and $AsH_3$. The at least one of AsH and $AsH_3$ also may decompose within the deposition chamber 302 to form As atoms, which may be adsorbed over the substrate 300 in the first layer of adsorbed elements 310.

If the dilute nitride III-V material to be deposited comprises GaInNAs, the first plurality of process gases may further comprise at least one precursor gas from which Ga may be adsorbed over the substrate 300 in the first layer of adsorbed elements 310, and at least one precursor gas from which In may be adsorbed over the substrate 300 in the first layer of adsorbed elements 310. As non-limiting examples, gallium precursor gases that may be employed include trimethyl gallium ($Ga(CH_3)_3$) and triethyl gallium ($Ga(C_2H_5)_3$). Similarly, indium precursor gases that may be employed include trimethyl indium ($In(CH_3)_3$) and triethyl indium ($In(C_2H_5)_3$).

During the deposition process, the temperature of the substrate 300, the temperature and pressure within the deposition chamber 302, as well as the flow rates and partial pressures of the process gases (e.g., arsenic-containing gas, hydrogen gas, nitrogen carrier gas, etc.) flowing through the deposition chamber 302 may be adjusted in a manner that results in adsorption of the As and one or more of B, Al, Ga, In, and Ti over the substrate 300 in the first layer of adsorbed elements 310. The various parameters of the process may be varied depending on, for example, the composition of the arsenic-containing gas or vapor, and the desired elemental constituents to be adsorbed as part of the first layer of adsorbed elements 310.

Figure 5:
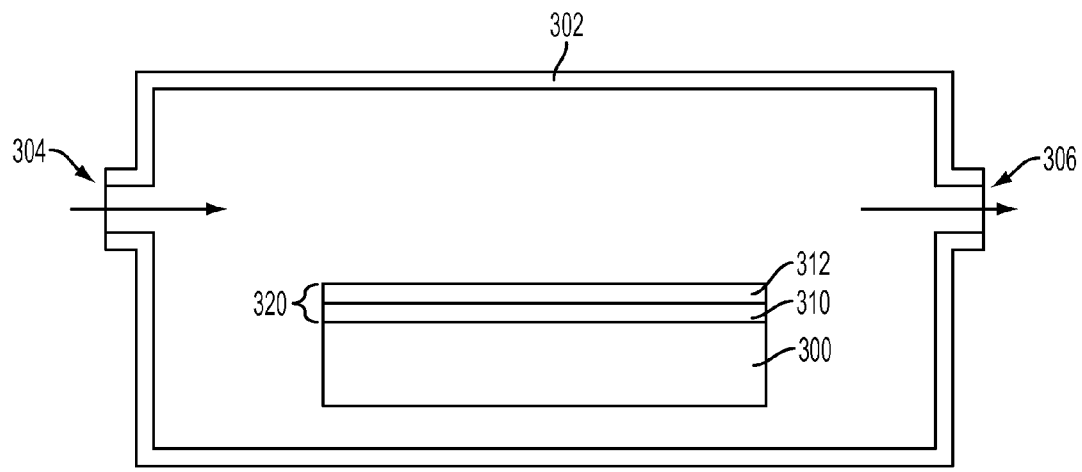

Referring to FIG. 5, after introducing the first plurality of gases into the deposition chamber 302 to form the first layer of adsorbed elements 310 over the substrate 300 (as described with reference to FIG. 4), a second plurality of process gases may be introduced into the deposition chamber 302 by flowing the second plurality of process gases through the deposition chamber 302 from the inlet 304 to the outlet 306.

The second plurality of process gases may include one or more precursor gases from which N and one or more of B, Al, Ga, In, and Ti may be adsorbed over the substrate 300 to form a second layer of adsorbed elements 312. The second layer of adsorbed elements 312 also may comprise a monolayer, or a few monolayers of elemental or molecular species, in some embodiments. The substrate 300 and/or the interior of the deposition chamber 302 may be heated in the presence of the one or more precursor gases to at least about 800° C. during deposition of the second layer of adsorbed elements 312.

The second plurality of process gases may include a nitrogen-containing precursor gas for the adsorption of the N. For example, the nitrogen-containing precursor gas may comprise ammonia ($NH_3$) or dimethyl hydrazine (DMH). Ammonia thermally decomposes at temperatures of about 1,000° C. and higher. Thus, in accordance with some embodiments, the substrate 300 and/or the interior of the deposition chamber 302 may be heated in the presence of a nitrogen-containing gas such as ammonia to at least about 1,000° C. during deposition of the second layer of adsorbed elements 312.

In some embodiments, the second plurality of process gases may be at least substantially free of arsenic-containing precursor gas. In other embodiments, the second plurality of process gases may include an arsenic-containing precursor gas to prevent desorption of As from the previously deposited first layer of adsorbed elements 310.

If the dilute nitride III-V material to be deposited comprises GaInNAs, the second plurality of process gases may further comprise at least one precursor gas from which Ga may be adsorbed over the substrate 300 in the second layer of adsorbed elements 312, and at least one precursor gas from which In may be adsorbed over the substrate 300 in the second layer of adsorbed elements 312. As non-limiting examples, gallium precursor gases that may be employed include trimethyl gallium ($Ga(CH_3)_3$) and triethyl gallium ($Ga(C_2H_5)_3$). Similarly, indium precursor gases that may be employed include trimethyl indium ($In(CH_3)_3$) and triethyl indium ($In(C_2H_5)_3$).

As previously mentioned, during the deposition process, the temperature of the substrate 300, the temperature and pressure within the deposition chamber 302, as well as the flow rates and partial pressures of the process gases (e.g., nitrogen-containing precursor gas, hydrogen gas, nitrogen carrier gas, etc.) flowing through the deposition chamber 302 may be adjusted in a manner that results in adsorption of the N and one or more of B, Al, Ga, In, and Ti over the substrate 300 in the second layer of adsorbed elements 312. The various parameters of the process may be varied depending on, for example, the composition of the arsenic-containing gas or vapor, and the desired elemental constituents to be adsorbed as part of the second layer of adsorbed elements 312.

The sequential deposition of the first layer of adsorbed elements 310 and the second layer of adsorbed elements 312 may result in epitaxial growth of a layer of dilute nitride III-V semiconductor material 320 (e.g., InGaNAs) on the substrate 300 in the deposition chamber 302 in an ALD or ALD-like process.

The deposition of the first layer of adsorbed elements 310 and the deposition of the second layer of adsorbed elements 312 over the substrate 300 may be sequentially repeated one or more times to increase a thickness of the dilute nitride III-V semiconductor material 320 on the substrate 300. For example, referring to FIG. 6, another layer of adsorbed elements 310' like the first layer of adsorbed elements 310 may be deposited over the substrate 300 using methods discussed above with reference to FIG. 4, after which another layer of adsorbed elements 312' like the second layer of adsorbed elements 312 may be deposited over the substrate 300 using methods discussed above with reference to FIG. 5. This process could be repeated any number of times until a layer of dilute nitride III-V semiconductor material 320 is formed having a desirable total thickness.

Figure 6:
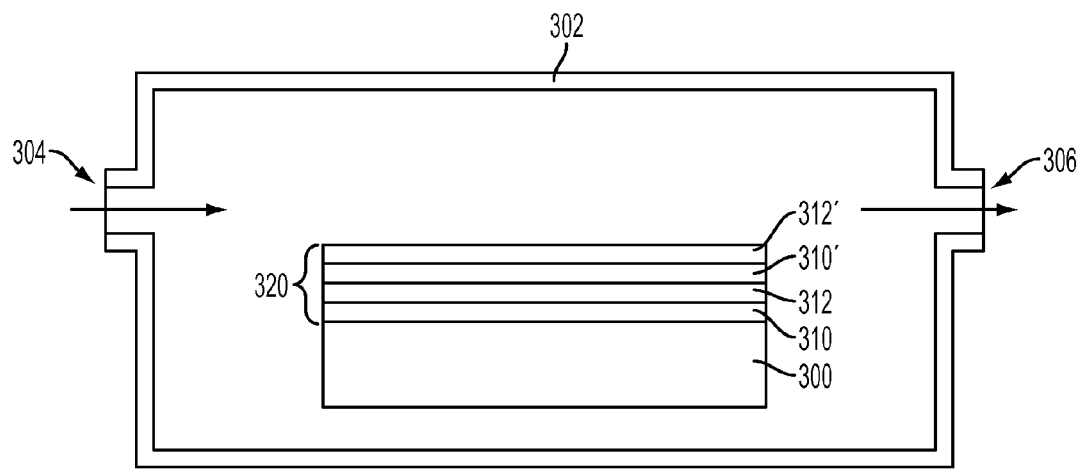

Although the layers of adsorbed elements 310, 312, 310', 312' are illustrated in a simplified manner in FIGS. 5 and 6 as separately identifiable layers with boundaries therebetween for purposes of illustration, those of ordinary skill in the art will appreciate that the epitaxial layer of dilute nitride III-V semiconductor material 320, although formed by the sequential deposition of the layers of adsorbed elements 310, 312, 310', 312', may comprise a generally homogeneous layer of crystalline material without any identifiable boundaries therein, and may consist essentially of a single crystal of dilute nitride III-V semiconductor material 320 composed of the elements sequentially adsorbed as the layers of adsorbed elements 310, 312, 310', 312'.

After forming the dilute nitride III-V semiconductor material 320 (e.g., InGaNAs) as described above, the resulting structure may be further processed to form a photoactive device, such as one of the multi junction photovoltaic cells 100, 200 of FIGS. 1 and 2, a light-emitting diode, or a laser diode.

Additional non-limiting embodiments of the disclosure are set forth below as examples.

Embodiment 1

A method of fabricating a dilute nitride III-V semiconductor material, comprising: flowing a first plurality of process gases into a deposition chamber, the first plurality of process gases including an arsenic-containing precursor gas; depositing a first layer comprising As and one or more of B, Al, Ga, In, and Ti over a substrate in the deposition chamber from the first plurality of process gases, the first layer being at least substantially free of N; after depositing the first layer, flowing a second plurality of process gases into the deposition chamber, the second plurality of process gases including a nitrogen-containing precursor gas; depositing a second layer comprising N and one or more of B, Al, Ga, In, and Ti over the substrate in the deposition chamber from the second plurality of process gases; and epitaxially growing a dilute nitride III-V semiconductor material over the substrate in the deposition chamber using the first layer and the second layer.

Embodiment 2

The method of Embodiment 1, wherein the first plurality of process gases is at least substantially free of nitrogen-containing precursor gas.

Embodiment 3

The method of Embodiment 1 or Embodiment 2, wherein the second plurality of process gases is at least substantially free of arsenic-containing precursor gas.

Embodiment 4

The method of any one of Embodiments 1 through 3, wherein epitaxially growing a dilute nitride III-V semiconductor material over the substrate comprises forming GaInNas over the substrate.

Embodiment 5

The method of Embodiment 4, further comprising foaming the GaInNAs to comprise $Ga_{1-y}In_yN_xAs_{1-x}$, wherein y is greater than 0.0 and less than 1.0, and x is between about 0.1 and about 0.5.

Embodiment 6

The method of Embodiment 5, further comprising forming the GaInNAs to exhibit a bandgap energy of between about 0.9 eV and about 1.2 eV.

Embodiment 7

The method of any one of Embodiments 4 through 6, further comprising selecting the substrate to comprise GaAs, and wherein epitaxially growing the dilute nitride III-V semiconductor material over the substrate comprises epitaxially growing the GaInNAs directly on the GaAs.

Embodiment 8

The method of any one of Embodiments 1 through 7, further comprising selecting the first plurality of process gases to include an indium-containing precursor gas, a gallium-containing precursor gas, and an arsenic-containing precursor gas.

Embodiment 9

The method of Embodiment 8, further comprising selecting the arsenic-containing precursor gas to comprise $AsR_3$, wherein each R is individually selected from the group consisting of hydrogen, alkyl, aryl, and vinyl groups.

Embodiment 10

The method of Embodiment 9, further comprising selecting the arsenic-containing precursor gas to comprise at least one of arsine and a metalorganic arsine precursor.

Embodiment 11

The method of Embodiment 10, further comprising selecting the arsenic-containing precursor gas to comprise arsine.

Embodiment 12

The method of Embodiment 10, further comprising selecting the arsenic-containing precursor gas to comprise tertiary-butylarsine.

Embodiment 13

The method of any one of Embodiments 1 through 12, further comprising selecting the second plurality of process gases to include an indium-containing precursor gas, a gallium-containing precursor gas, and a nitrogen-containing precursor gas.

Embodiment 14

The method of Embodiment 13, further comprising selecting the nitrogen-containing precursor gas to comprise ammonia.

Embodiment 15

The method of any one of Embodiments 1 through 14, further comprising heating the substrate during deposition of the first layer and deposition of the second layer.

Embodiment 16

The method of Embodiment 15, wherein heating the substrate during deposition of the first layer and deposition of the second layer comprises heating the substrate to a temperature of at least about 500° C. during deposition of the first layer and heating the substrate to a temperature of at least about 800° C. during deposition of the second layer.

Embodiment 17

The method of any one of Embodiments 1 through 16, further comprising sequentially repeating the deposition of the first layer and the deposition of the second layer one or more times to increase a thickness of the dilute nitride III-V semiconductor material over the substrate.

Embodiment 18

The method of any one of Embodiments 1 through 17, further comprising forming a multi-junction photovoltaic cell comprising the dilute nitride III-V semiconductor material.

Embodiment 19

The method of any one of Embodiments 1 through 17, further comprising forming a light-emitting device comprising the dilute nitride III-V semiconductor material.

Embodiment 20

The method of Embodiment 19, further comprising forming the light-emitting device to comprise a laser diode.

Embodiment 21

A method of fabricating a photoactive device, comprising: positioning a substrate within a deposition chamber; flowing a first composition of process gases into the deposition chamber and adsorbing As and one or more of B, Al, Ga, In, and Ti over the substrate in the deposition chamber; after flowing the first composition of process gases into the deposition chamber, flowing a second composition of process gases into the deposition chamber and adsorbing N and one or more of B, Al, Ga, In, and Ti over the substrate in the deposition chamber; and forming an epitaxial layer of dilute nitride III-V semiconductor material over the substrate in the deposition chamber from the adsorbed elements over the substrate.

Embodiment 22

The method of Embodiment 21, wherein forming an epitaxial layer of dilute nitride III-V semiconductor material over the substrate comprises forming an epitaxial layer of GaInNAs over the substrate.

Embodiment 23

The method of Embodiment 22, further comprising forming the GaInNAs to comprise $Ga_{1-y}In_yN_xAs_{1-x}$, wherein y is greater than 0.0 and less than 1.0, and x is between about 0.1 and about 0.5.

Embodiment 24

The method of Embodiment 22 or Embodiment 23, further comprising forming the GaInNAs to exhibit a bandgap energy of between about 0.90 eV and about 1.2 eV.

Embodiment 25

The method of any one of Embodiments 21 through 24, further comprising formulating the first composition of process gases to be at least substantially free of nitrogen-containing precursor gas.

Embodiment 26

The method of any one of Embodiments 21 through 25, further comprising formulating the second composition of process gases to be at least substantially free of arsenic-containing precursor gas.

Embodiment 27

The method of any one of Embodiments 21 through 26, wherein flowing a first composition of process gases into the deposition chamber comprises flowing an arsenic-containing precursor gas into the deposition chamber, the arsenic-containing precursor gas comprising $AsR_3$, wherein each R is individually selected from the group consisting of hydrogen, alkyl, aryl, and vinyl groups.

Embodiment 28

The method of Embodiment 27, further comprising selecting the arsenic-containing precursor gas to comprise at least one of arsine and a metalorganic arsine precursor.

Embodiment 29

The method of Embodiment 28, further comprising selecting the arsenic-containing precursor gas to comprise arsine.

Embodiment 30

The method of Embodiment 28, further comprising selecting the arsenic-containing precursor gas to comprise tertiarybutylarsine.

Embodiment 31

The method of any one of Embodiments 21 through 30, further comprising sequentially repeating the adsorption of As and one or more of B, Al, Ga, In, and Ti and the adsorption of N and one or more of B, Al, Ga, In, and Ti over the substrate one or more times to increase a thickness of the epitaxial layer of dilute nitride III-V semiconductor material over the substrate.

Embodiment 32

The method of any one of Embodiments 21 through 31, further comprising forming a multi-junction photovoltaic cell comprising the epitaxial layer of dilute nitride III-V semiconductor material.

Embodiment 33

The method of any one of Embodiments 21 through 31, further comprising forming a light-emitting device comprising the epitaxial layer of dilute nitride III-V semiconductor material.

Embodiment 34

The method of Embodiment 33, further comprising foaming the light-emitting device to comprise a laser diode.

Embodiment 35

A photoactive device formed by a method as recited in any one of Embodiments 1 through 34.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. Such modifications are also intended to fall within the scope of the appended claims.

What is claimed is:

1. A method of fabricating a dilute nitride III-V semiconductor material, comprising:
   using an atomic layer deposition (ALD) process to epitaxially grow a monocrystalline layer of dilute nitride III-V semiconductor material over a substrate in a deposition chamber, the ALD process including:
   a first step of flowing a first plurality of process gases into the deposition chamber, the first plurality of process gases including an arsenic-containing precursor gas, and depositing a first layer comprising As and one or more of B, Al, Ga, In, and Ti over the substrate in the deposition chamber from the first plurality of process gases, the first layer being at least substantially free of N, wherein the substrate is heated to a temperature of at least 500° C. during deposition of the first layer; and
   after the first step, a second step of flowing a second plurality of process gases into the deposition chamber, the second plurality of process gases including a nitrogen-containing precursor gas, and depositing a second layer comprising N and one or more of B, Al, Ga, In, and Ti over the substrate in the deposition chamber from the second plurality of process gases, wherein the substrate is heated to a temperature of at least 800° C. during deposition of the second layer; and
   sequentially repeating the first step and the second step one or more times so as to form the monocrystalline layer of dilute nitride III-V semiconductor material.

2. The method of claim 1, wherein the first plurality of process gases is at least substantially free of nitrogen-containing precursor gas.

3. The method of claim 1, wherein the second plurality of process gases is at least substantially free of arsenic-containing precursor gas.

4. The method of claim 1, wherein using an atomic layer deposition (ALD) process to epitaxially grow a monocrystalline layer of dilute nitride III-V semiconductor material over the substrate comprises forming GaInNAs over the substrate.

5. The method of claim 4, further comprising forming the GaInNAs to comprise $Ga_{1-y}In_yN_xAs_{1-x}$, wherein y is greater than 0.0 and less than 1.0, and x is between 0.1 and 0.5.

6. The method of claim 5, further comprising forming the GaInNAs to exhibit a bandgap energy of between 0.9 eV and 1.2 eV.

7. The method of claim 4, further comprising selecting the first plurality of process gases to include an indium-containing precursor gas, a gallium-containing precursor gas, and an arsenic-containing precursor gas.

8. The method of claim 7, further comprising selecting the arsenic-containing precursor gas to comprise $AsR_3$, wherein each R is individually selected from the group consisting of hydrogen, alkyl, aryl, and vinyl groups.

9. The method of claim 8, further comprising selecting the arsenic-containing precursor gas to comprise at least one of arsine and a metalorganic arsine precursor.

10. The method of claim 9, further comprising selecting the arsenic-containing precursor gas to comprise arsine.

11. The method of claim 9, further comprising selecting the arsenic-containing precursor gas to comprise tertiarybutylarsine.

12. The method of claim 4, further comprising selecting the second plurality of process gases to include an indium-containing precursor gas, a gallium-containing precursor gas, and a nitrogen-containing precursor gas.

13. The method of claim 12, further comprising selecting the nitrogen-containing precursor gas to comprise ammonia.

14. The method of claim 4, further comprising selecting the substrate to comprise GaAs, and wherein using an atomic layer deposition (ALD) process to epitaxially grow a monocrystalline layer of dilute nitride III-V semiconductor material over the substrate comprises epitaxially growing the GaInNAs directly on the GaAs.

15. The method of claim 1, further comprising forming a multi-junction photovoltaic cell comprising the dilute nitride III-V semiconductor material.

16. The method of claim 1, further comprising forming a light-emitting device comprising the dilute nitride III-V semiconductor material.

17. The method of claim 16, further comprising forming the light-emitting device to comprise a laser diode.

18. A method of fabricating a photoactive device, comprising:
    positioning a substrate within a deposition chamber; and
    using an atomic layer deposition (ALD) process to epitaxially grow a monocrystalline layer of dilute nitride III-V semiconductor material over the substrate in the deposition chamber, the ALD process including:
        a first step of heating the substrate to a temperature of at least 500° C. while flowing a first composition of process gases into the deposition chamber and adsorbing As and one or more of B, Al, Ga, In, and Ti over the substrate in the deposition chamber;
        after the first step, a second step of heating the substrate to a temperature of at least 800° C. while flowing a second composition of process gases into the deposition chamber and adsorbing N and one or more of B, Al, Ga, In, and Ti over the substrate in the deposition chamber; and
        sequentially repeating the first step and the second step one or more times and epitaxially growing the monocrystalline layer of dilute nitride III-V semiconductor material over the substrate in the deposition chamber from the adsorbed elements over the substrate.

19. The method of claim 18, wherein using an atomic layer deposition (ALD) epitaxially grow a monocrystalline layer of dilute nitride III-V semiconductor material over the substrate comprises forming an epitaxial layer of GaInNAs over the substrate.

20. The method of claim 19, further comprising forming the GaInNAs to comprise $Ga_{1-y}In_yN_xAs_{1-x}$, wherein y is greater than 0.0 and less than 1.0, and x is between 0.1 and 0.5.

21. The method of claim 20, further comprising forming the GaInNAs to exhibit a bandgap energy of between 0.9 eV and 1.2 eV.

22. The method of claim 18, further comprising formulating the first composition of process gases to be at least substantially free of nitrogen-containing precursor gas.

23. The method of claim 18, further comprising formulating the second composition of process gases to be at least substantially free of arsenic-containing precursor gas.

24. The method of claim 18, wherein flowing a first composition of process gases into the deposition chamber comprises flowing an arsenic-containing precursor gas into the deposition chamber, the arsenic-containing precursor gas comprising $AsR_3$, wherein each R is individually selected from the group consisting of hydrogen, alkyl, aryl, and vinyl groups.

25. The method of claim 24, further comprising selecting the arsenic-containing precursor gas to comprise at least one of arsine and a metalorganic arsine precursor.

26. The method of claim 25, further comprising selecting the arsenic-containing precursor gas to comprise arsine.

27. The method of claim 25, further comprising selecting the arsenic-containing precursor gas to comprise tertiarybutylarsine.

28. The method of claim 18, further comprising forming a multi-junction photovoltaic cell comprising the dilute nitride III-V semiconductor material.

29. The method of claim 18, further comprising forming a light-emitting device comprising the dilute nitride III-V semiconductor material.

30. The method of claim 29, further comprising forming the light-emitting device to comprise a laser diode.

* * * * *